United States Patent
Li et al.

(10) Patent No.: US 12,013,426 B2
(45) Date of Patent: Jun. 18, 2024

(54) METHOD FOR DC ISLANDING DETECTION BASED ON POSITIVE FEEDBACK OF BUS VOLTAGE AT SPECIFIC FREQUENCY

(71) Applicant: Zhejiang University, Hangzhou (CN)

(72) Inventors: Wuhua Li, Hangzhou (CN); Qinghui Huang, Hangzhou (CN); Chushan Li, Hangzhou (CN); Heya Yang, Hangzhou (CN); Xiaowei Gu, Hangzhou (CN); Min Chen, Hangzhou (CN); Huan Yang, Hangzhou (CN); Xiangning He, Hangzhou (CN)

(73) Assignee: Zhejiang University, Hangzhou (CN)

( * ) Notice: Subject to any disclaimer, the term of this patent is extended or adjusted under 35 U.S.C. 154(b) by 357 days.

(21) Appl. No.: 17/429,006

(22) PCT Filed: Jun. 1, 2020

(86) PCT No.: PCT/CN2020/093795
§ 371 (c)(1),
(2) Date: Aug. 6, 2021

(87) PCT Pub. No.: WO2021/000682
PCT Pub. Date: Jan. 7, 2021

(65) Prior Publication Data
US 2022/0011358 A1    Jan. 13, 2022

(30) Foreign Application Priority Data
Jul. 1, 2019    (CN) .......................... 201910586183.2

(51) Int. Cl.
G05B 13/02    (2006.01)
G01R 19/25    (2006.01)
(Continued)

(52) U.S. Cl.
CPC ....... *G01R 31/086* (2013.01); *G01R 19/2513* (2013.01); *G05B 13/022* (2013.01); *H02J 3/388* (2020.01)

(58) Field of Classification Search
CPC .. G01R 31/086; G01R 19/2513; G01R 31/00; H02J 3/388; H02J 1/102; H02J 1/106; H02J 1/12; G05B 13/022
See application file for complete search history.

(56) References Cited

U.S. PATENT DOCUMENTS

| 2014/0103727 A1* | 4/2014 | Taimela | H02J 3/381 |
| | | | 307/76 |
| 2015/0120221 A1* | 4/2015 | Ding | H02J 3/38 |
| | | | 702/60 |
| 2016/0099572 A1* | 4/2016 | Gupta | H02J 9/06 |
| | | | 323/234 |

FOREIGN PATENT DOCUMENTS

| CN | 102262182 A | 11/2011 |
| CN | 102830312 A | 12/2012 |

(Continued)

OTHER PUBLICATIONS

A. H. Fathi-Jowzdani, I. Sadeghkhani and A. Mehrizi-Sani, "Islanding Detection for DC Microgrids Based on Episode of Care Severity Index," in IEEE Transactions on Smart Grid, vol. 13, No. 2, pp. 954-961, Mar. 2022 [Date of retrieval Sep. 22, 2023]. (Year: 2022).*

(Continued)

*Primary Examiner* — Kenneth M Lo
*Assistant Examiner* — Mohammed Shafayet
(74) *Attorney, Agent, or Firm* — NZ Carr Law Office (57) ABSTRACT

A method for a direct current (DC) islanding detection based on positive feedback of a bus voltage at a specific frequency, essentially including three steps: extraction of a specific frequency component of the bus voltage, injection of a disturbance component of the specific frequency, and deter- (Continued)

mination of DC islanding. The extraction of the specific frequency component of the bus voltage and the injection of the disturbance component of the specific frequency constitute a positive feedback mechanism in a power management unit control loop. In a grid-connected mode of a DC grid, the positive feedback mechanism fails due to a control action of a voltage management unit on a bus, and the bus voltage remains stable. In an islanding mode of the DC grid, under an action of the positive feedback mechanism, the power management unit allows the bus voltage to generate a self-excited oscillation at the specific frequency.

5 Claims, 6 Drawing Sheets

(51) Int. Cl.
    *G01R 31/08*     (2020.01)
    *H02J 3/38*     (2006.01)

(56) References Cited

FOREIGN PATENT DOCUMENTS

| CN | 104569685 A | 4/2015 |
| CN | 105467237 A | 4/2016 |
| CN | 110376483 A | 10/2019 |
| KR | 20110070023 A | 6/2011 |

OTHER PUBLICATIONS

A. Timbus, A. Oudalov and C. N. M. Ho, "Islanding detection in smart grids," 2010 IEEE Energy Conversion Congress and Exposition, Atlanta, GA, USA, 2010, pp. 3631-3637, [Date of retrieval Sep. 22, 2023]. (Year: 2010).*

* cited by examiner

(a) Bus voltage when inner loop is disturbed (b) Frequency of specific frequency component of bus voltage when inner loop is disturbed (c) DC islanding indicator when inner loop is disturbed

FIG. 11

(a) Bus voltage when outer loop is disturbed (b) Frequency of specific frequency component of bus voltage when outer loop is disturbed (c) DC islanding indicator when outer loop is disturbed

METHOD FOR DC ISLANDING DETECTION BASED ON POSITIVE FEEDBACK OF BUS VOLTAGE AT SPECIFIC FREQUENCY

CROSS REFERENCE TO THE RELATED APPLICATIONS

This application is the national stage entry of International Application No. PCT/CN2020/093795, filed on Jun. 1, 2020, which is based upon and claims priority to Chinese Patent Application No. 201910586183.2 filed on Jul. 1, 2019, the entire contents of which are incorporated herein by reference.

TECHNICAL FIELD

The present disclosure relates to the field of distributed power generation, DC power grid, and AC/DC hybrid power grid, and more particularly, to a method for DC islanding detection based on positive feedback of a bus voltage at a specific frequency.

BACKGROUND

With the continuous consumption of fossil energy resources, the problem of energy crisis has become increasingly prominent. Renewable energy power generation will become the only way to replace the fossil energy resources. The rapid development of new energy power generation and electric vehicles has made the proportions of supplies and loads with direct current (DC) attributes in a power grid increasing. Compared with an alternating current (AC) power grid, a DC power grid has many advantages such as higher efficiency, lower cost, and better power quality, and thus become an important part of modern power systems. DC islanding detection is a key technology to ensure safe power supply after the formation of local islanding. Originated from the AC power grid, islanding refers to the disconnection between a regional power grid and a main power grid due to a fault or blackout maintenance in the main power grid. However, due to the lack of high-speed communication devices, distributed power sources in the regional power grid fail to detect power outage states of the main power grid and continue supplying power to the loads, thus forming self-powered islanding. After the islanding occurs, the continuous injection of electric energy into the power grid by the distributed power sources may endanger safety of maintenance personnel on power transmission lines. Since the local power grid has lost the support of voltage and frequency, when outputs of the distributed power sources change or the loads suddenly change, the system voltage and the frequency may shift, which may damage electric equipment. Therefore, it is necessary to detect in time that a system is operating in an islanding state.

Component units of the DC power grid are integrated into the DC power grid mainly through power electronic devices, and according to external characteristics of converters, the converters can be classified into two categories: a power management unit and a voltage management unit. After the voltage management unit is disconnected from a DC bus due to a fault or overhaul, only the power management unit in the system continues supplying power to the loads, such that self-powered DC islanding is formed. At this moment, the bus voltage of the DC system is in an out-of-control state, which is referred to as unconscious DC islanding.

Figure 1:
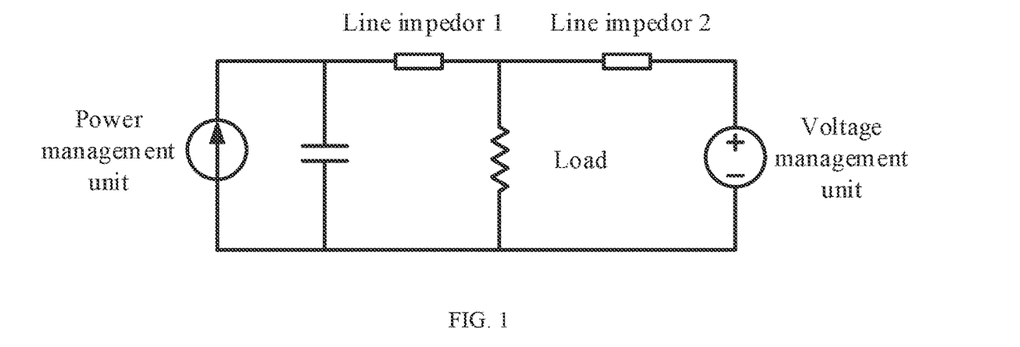
FIG. 1 is an equivalent circuit diagram of a DC grid in a grid-connected mode according to an embodiment of the present disclosure.
Figure 2:
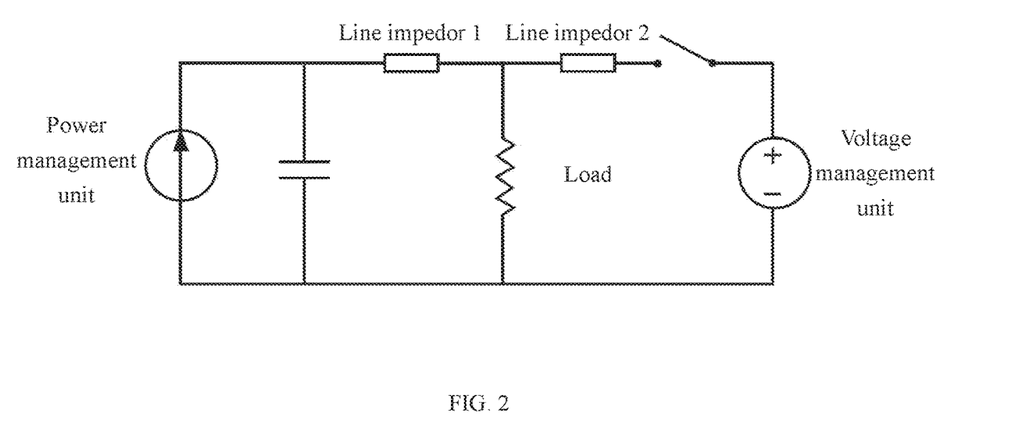
FIG. 2 is an equivalent circuit diagram of the DC grid in an islanding mode according to an embodiment of the present disclosure.

An equivalent model of the DC power grid in a grid-connected mode is as shown in FIG. 1, where the AC power grid or the DC power grid and a grid-connected converter are jointly equivalent to the voltage management unit to maintain the stability of the bus voltage of the system, and a distributed power generation unit is equivalent to the power management unit. The voltage management unit and the power management unit jointly supply power to the load. When the voltage management unit loses connection with the DC bus due to a fault or dispatch, the power management unit and the load form self-powered islanding, as shown in FIG. 2. If the DC islanding occurs, the power generation of the distributed power source coincides with the power consumption of the load, and the DC bus voltage will not fluctuate basically. At this moment, a passive detection method based on voltage offset will have a detection blind zone, and thus it is unable to detect in time that the system is in an islanding mode.

Islanding detection technologies for the AC system mainly use characteristic quantities of the AC system, such as frequencies, reactive power, harmonic waves, etc. Since only bus voltage magnitudes in the DC system are employed to characterize operating states of the system, the AC islanding detection method cannot be directly used in the DC system. Therefore, an islanding detection method suitable for the DC system is needed to improve the islanding ride-through capability of the DC system.

SUMMARY

In order to eliminate the detection blind zone of a passive DC islanding detection technology under power matching conditions, the present disclosure provides a method for DC islanding detection based on positive feedback of a bus voltage at a specific frequency, which can quickly detect the occurrence of DC islanding and can eliminate the detection blind zone.

The present disclosure first discloses a method for DC islanding detection based on positive feedback of a bus voltage at a specific frequency, including extraction of a specific frequency component of the bus voltage, injection of a disturbance component of the specific frequency, and determination of DC islanding.

The extraction of the specific frequency component of the bus voltage includes:
  collecting information of the bus voltage in real time and sending the same to a bandpass filter by a power management unit in a DC system to obtain the specific frequency component of the bus voltage, wherein the bandpass filter is a unity gain resonance amplifier, and the specific frequency component is a resonance frequency of the unity gain resonance amplifier.

The injection of the disturbance component of the specific frequency includes:
  sending the specific frequency component of the bus voltage to a proportional amplifier to obtain the disturbance component, and superimposing the disturbance component on a converter control inner loop instruction value or superimposing the disturbance component on a converter control outer loop instruction value, and then forming the positive feedback of the specific frequency component of the bus voltage on a control loop of a converter, wherein a method for selecting the resonance frequency of the unity gain resonance amplifier includes as follows: a magnitude gain of a transfer function from the disturbance component to the bus voltage is represented by $k_2(f)$ in an islanding mode, the magnitude gain of the transfer function from the disturbance component to the bus voltage is represented by $k_1(f)$ in a grid-connected mode, a difference therebetween is defined as $G=k_2(f)-k_1(f)$, and a frequency $f_0$ corresponding to a maximum value of G is selected as the resonance frequency of the unity gain resonance amplifier.

The determination of DC islanding includes:

determining whether DC islanding occurs according to a variation trend of the specific frequency component of the bus voltage, determining that the system is operating in the islanding mode if the specific frequency component of the bus voltage continuous to increase and the number of sustained oscillation cycles exceeds a detection set value, or determining that the system is operating in the grid-connected mode if there is no specific frequency component in the bus voltage or the specific frequency component continuous to decrease, wherein a set value of the number of the oscillation cycles in the determination of DC islanding is three.

Alternatively, when a selection principle of a coefficient $k_P$ of a proportional amplification link is: if the DC system is in the islanding mode, a positive feedback mechanism is formed between the specific frequency component of the bus voltage and the disturbance component, and the bus voltage has a self-excited oscillation at this frequency; in the grid-connected mode, due to the suppression effect of the voltage management unit, the positive feedback mechanism fails, and the bus voltage remains stable. In the islanding mode, the product of the corresponding magnitude gain $k_2(f_0)$ of $k_2(f)$ at $f_0$ and the amplification coefficient $k_P$ of the proportional amplifier should be greater than 1; in the grid-connected mode, the product of the corresponding magnitude gain $k_1(f_0)$ of $k_1(f)$ at $f_0$ and the amplification coefficient $k_P$ of the proportional amplifier should be less than 1.

Alternatively, superimposing the disturbance component on the converter control inner loop instruction value specifically includes: superimposing the disturbance component on a current instruction value of a converter control inner loop to generate a new control instruction, and sending the new control instruction to a current control inner loop.

Alternatively, superimposing the disturbance component on the converter control outer loop instruction value specifically includes: superimposing the disturbance component on a power instruction value of a converter control outer loop to generate a new control instruction, and sending the new control instruction to a power control outer loop.

Alternatively, superimposing the disturbance component on the converter control outer loop instruction value specifically includes: superimposing the disturbance component on a photovoltaic port voltage instruction value of a photovoltaic converter control outer loop to generate a new control instruction, and sending the new control instruction to a photovoltaic port voltage control outer loop.

Alternatively, superimposing the disturbance component on the converter control outer loop instruction value specifically includes: superimposing the disturbance component on a torque instruction value of a fan converter control outer loop to generate a new control instruction, and sending the new control instruction to a torque control outer loop.

The present disclosure has the following beneficial effects.

1. In the present disclosure, a voltage positive feedback mechanism is introduced, such that when the DC grid is in the islanding mode, the positive feedback of the bus voltage at the specific frequency causes the bus voltage to oscillate at the specific frequency due to the lack of the voltage management unit. However, in the grid-connected mode, the voltage management unit makes the positive feedback fail, such that the bus voltage remains stable, and thus a stable operation is ensured. The detection accuracy of this method has nothing to do with a fact whether the power generation matches the power consumption of the system. That is, there is no detection blind zone.

2. In the present disclosure, a frequency selection link is added into the voltage positive feedback, such that the oscillation frequency of the bus voltage in the islanding mode is specific, and a false detection resulted from voltage fluctuation caused by sudden load change or output change of a power generation unit can be prevented, and thus the accuracy of the islanding detection is improved.

3. Compared with a traditional injection islanding detection method, the islanding detection method provided by the present disclosure makes the design of a detection threshold relatively easy due to the introduction of the positive feedback and is insusceptible to system operating conditions and parameter changes. That is, this method has good compatibility.

4. The islanding detection method provided by the present disclosure is applicable to a multi-machine system including a plurality of distributed power sources.

DETAILED DESCRIPTION OF THE EMBODIMENTS

Technical solutions in the embodiments of the present disclosure will be clearly and completely described below with reference to the accompanying drawings of the present disclosure.

An equivalent model of a DC grid as shown in FIG. 1 mainly consists of a power management unit, a voltage management unit, and a load. Distributed power sources, such as photovoltaic power generation and wind power generation, in the DC grid may be equivalent to the power management unit to obtain clean energy to the maximum extent and to run in a maximum power point tracking mode. Because the capacity of a main grid is much larger than that of a distributed power generation system, a grid-connected interface converter often acts as the voltage management unit to maintain the stability of a bus voltage of the system, thereby achieving the balance between the power generation and the power consumption in the DC system. After a grid-connected switch is turned on, the system runs in a grid-connected mode, and the voltage management unit and the power management unit jointly supply power to the load. After the grid-connected switch is turned off, the system runs in an islanding mode, only the power management unit supplies power to the load, and the bus voltage is in an uncontrollable state, as shown in FIG. 2.

This method introduces positive feedback of a bus voltage at a specific frequency into a power unit control loop, such that the bus voltage generates a self-excited oscillation at a specific frequency when the DC system is in the islanding mode, while the bus voltage remains stable in the grid-connected mode, and detection of DC islanding is implemented based on a fact whether the specific frequency exists in the bus voltage.

Figure 13:
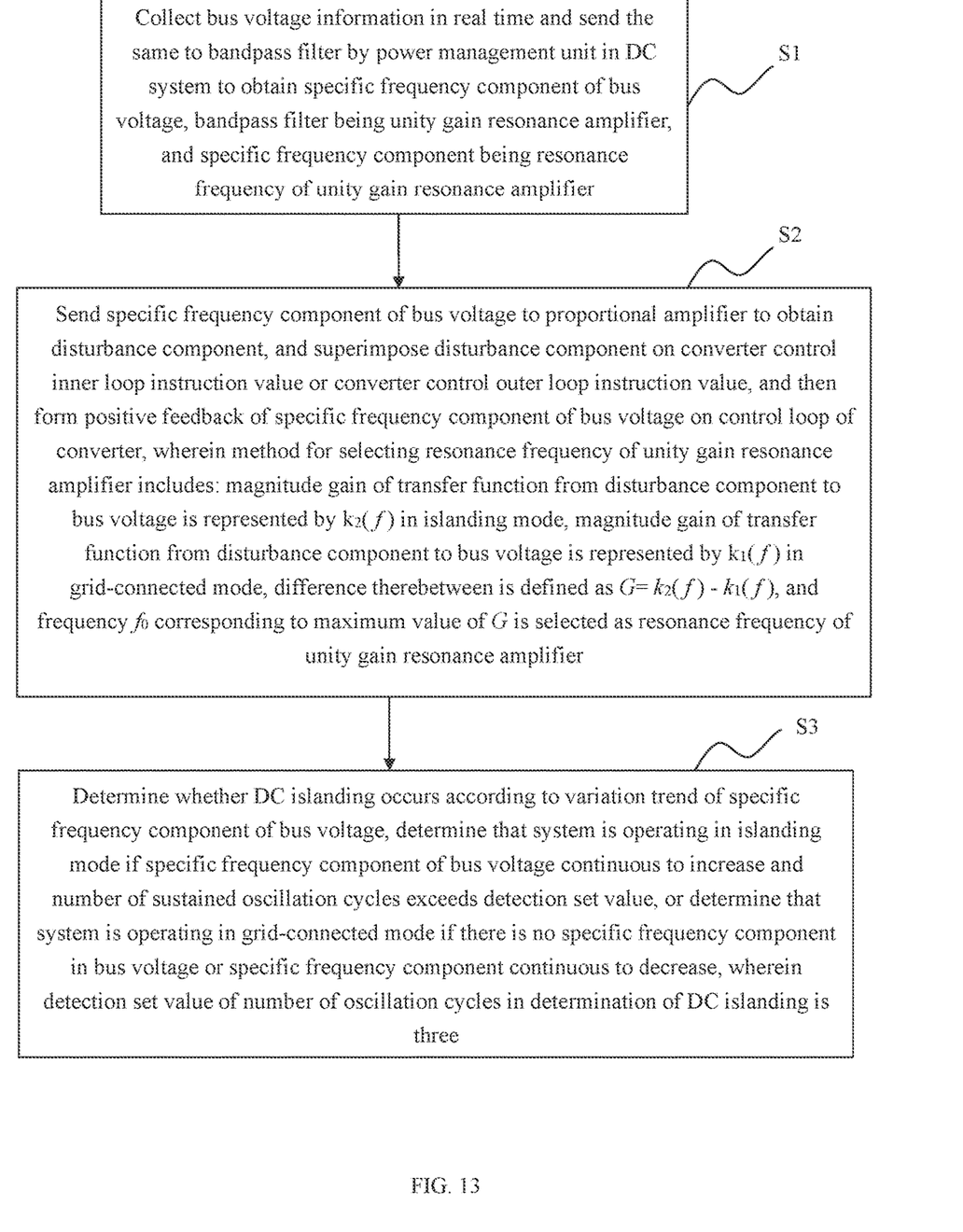
FIG. 13 illustrates a method for DC islanding detection based on positive feedback of a bus voltage at a specific frequency according to an embodiment of the present disclosure.

As shown in FIG. 13, the present disclosure provides the method for DC islanding detection based on the positive feedback of the bus voltage at the specific frequency including the following steps.

Step S1: Extraction of a Specific Frequency Component of the Bus Voltage

The power management unit in the DC system collects information of the bus voltage in real time and sends the same to a bandpass filter to obtain the specific frequency component of the bus voltage, wherein the bandpass filter is a unity gain resonance amplifier, and the specific frequency component is a resonance frequency of the unity gain resonance amplifier. The "specific frequency component of the bus voltage" mentioned in this application refers to a voltage component with a specific frequency, including both frequency and magnitude. The specific frequency component is obtained by superimposing a fluctuation component on the DC bus.

Step S2: Injection of a Disturbance Component of the Specific Frequency

The specific frequency component of the bus voltage is sent to a proportional amplifier to obtain the disturbance component, and the disturbance component is superimposed on a converter control inner loop instruction value or the disturbance component is superimposed on a converter control outer loop instruction value, and then the positive feedback of the specific frequency component of the bus voltage is formed on a control loop of a converter. A method for selecting the resonance frequency of the unity gain resonance amplifier in Step S1 includes as follows: a magnitude gain of a transfer function from the disturbance component to the bus voltage is represented by $k_2(f)$ in the islanding mode, the magnitude gain of the transfer function from the disturbance component to the bus voltage is represented by $k_1(f)$ in the grid-connected mode, a difference therebetween is defined as $G=k_2(f)-k_1(f)$, and a frequency $f_0$ corresponding to a maximum value of G is selected as the resonance frequency of the unity gain resonance amplifier. The calculation of the magnitude gain of the transfer function from the disturbance component to the bus voltage is an existing technology in this field and thus is not to be described in detail here.

Step S3: Determination of DC Islanding

It is determined whether DC islanding occurs according to a variation trend of the specific frequency component of the bus voltage. It is determined that the system is operating in the islanding mode if the specific frequency component of the bus voltage continuous to increase and the number of sustained oscillation cycles exceeds a detection set value. It is determined that the system is operating in the grid-connected mode if there is no specific frequency component in the bus voltage or the specific frequency component continuous to decrease, wherein the detection set value of the number of the oscillation cycles in the determination of DC islanding is three.

Figure 3:
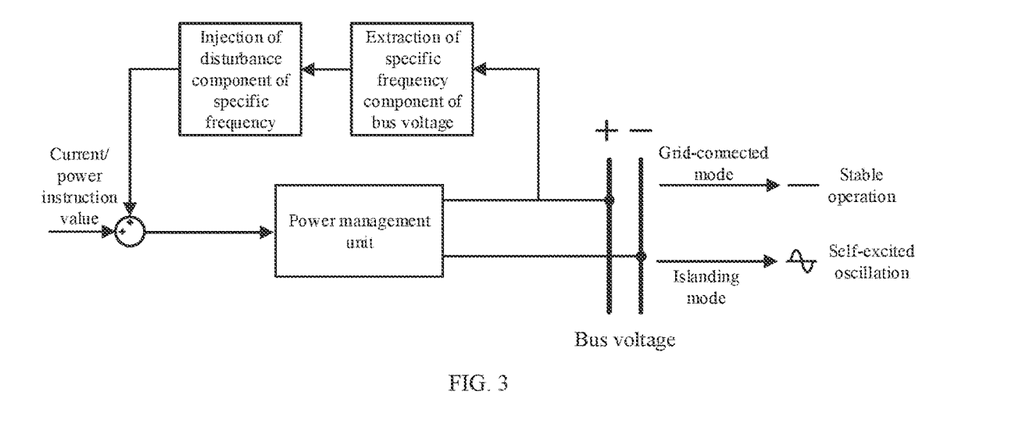
FIG. 3 is a schematic diagram of a bus voltage in the grid-connected mode and the islanding mode according to an embodiment of the present disclosure.

As shown in FIG. 3, when the DC grid is in the islanding mode, due to the lack of the voltage management unit, the positive feedback of the bus voltage at the specific frequency causes the bus voltage to oscillate at a specific frequency. In the grid-connected mode, the voltage management unit disables the positive feedback, such that the bus voltage remains stable.

Construction methods, parameter selection, and simulation results of the positive feedback of the bus voltage at the specific frequency are described in detail below by taking a photovoltaic power generation unit as an example.

Figure 4:
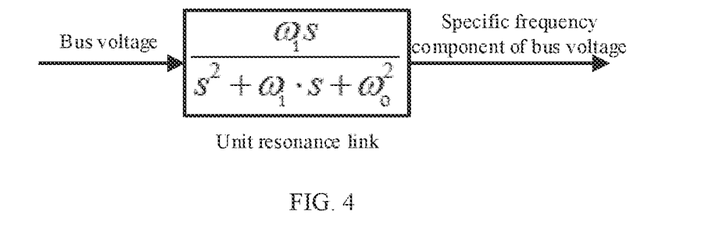
FIG. 4 is a schematic diagram of extraction of a specific frequency component of the bus voltage according to an embodiment of the present disclosure.
Figure 5:
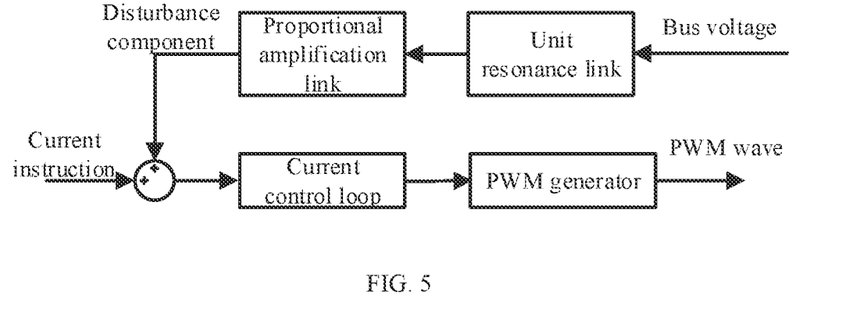
FIG. 5 is a block diagram of superimposing a disturbance component on a current control loop according to an embodiment of the present disclosure.
Figure 9:
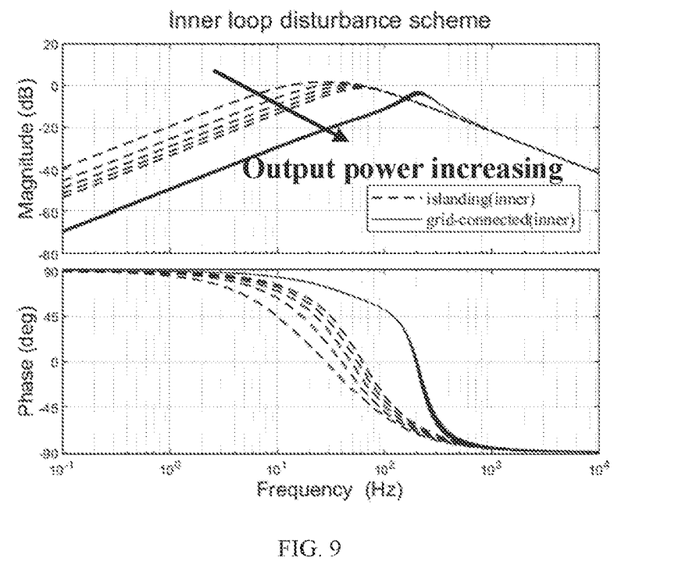
FIG. 9 illustrates magnitude-frequency response from the disturbance component to the bus voltage based on a current control inner loop disturbance injection method according to an embodiment of the present disclosure.
Figure 11:
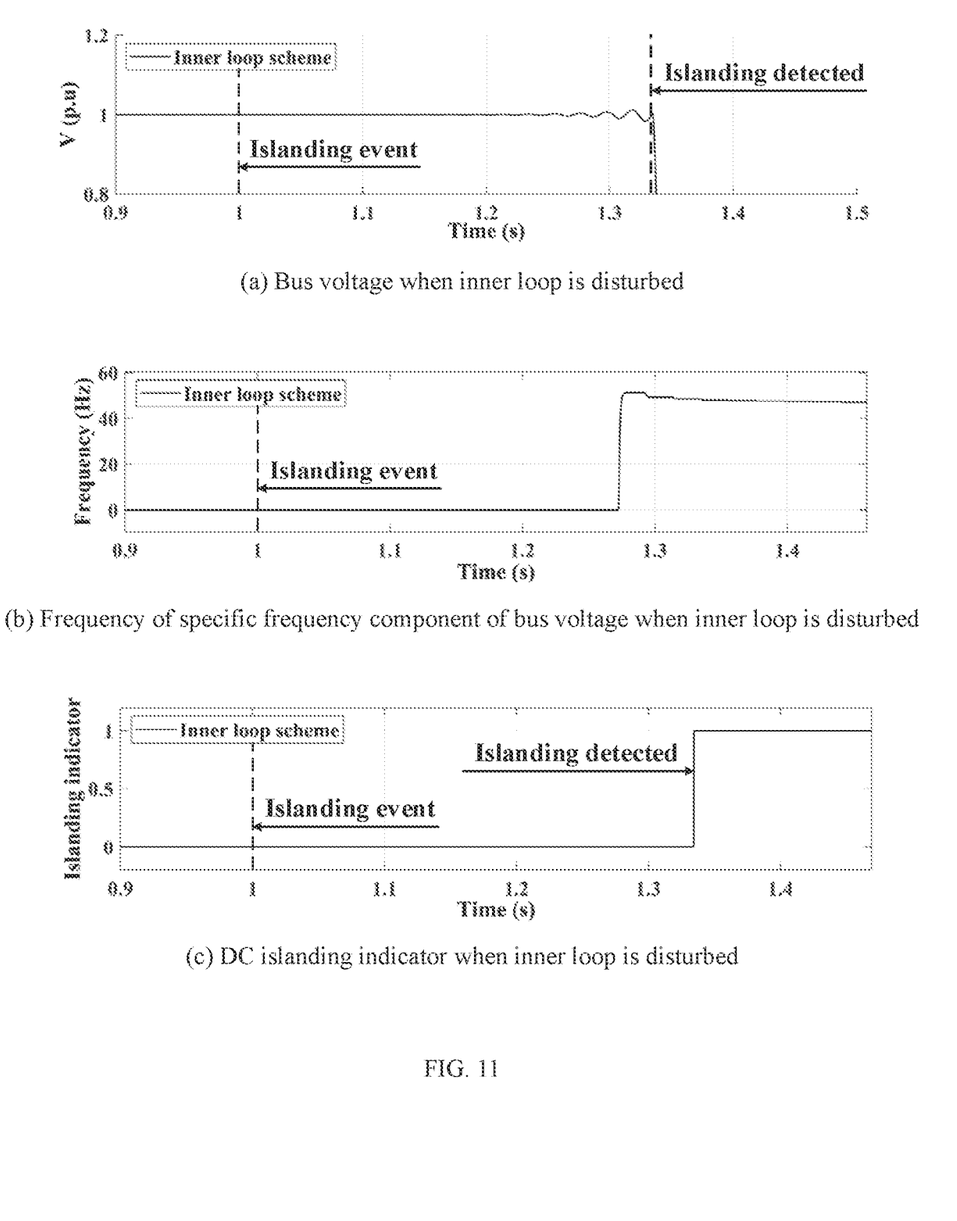
FIG. 11 is a diagram showing simulation results based on the current control inner loop disturbance injection method according to an embodiment of the present disclosure.

Embodiment 1: according to the method for DC islanding detection based on the positive feedback of disturbance component injection of a current control loop, as shown in FIG. 5, a sampling value of the bus voltage is sent to a unit resonance link having a bandpass filter. Further, as shown in FIG. 4, the specific frequency component of the bus voltage is obtained. In the figure, a cutoff frequency $\omega_i$ affects a bandwidth of the resonance link, a resonance frequency $\varphi_o$ determines the frequency at a quasi-resonance point, and S represents a Laplace operator transformed from a time domain to a frequency domain. The specific frequency component of the bus voltage is sent to a proportional amplification link to obtain the disturbance component. The disturbance component is superimposed on a current instruction value of the converter control inner loop to form the positive feedback of the bus voltage at the specific frequency, as shown in FIG. 5. As shown in FIG. 9, magnitude-frequency response from the disturbance component to the bus voltage in the grid-connected mode and the islanding mode at different output powers may be obtained according to circuit parameters and control parameters. A resonance frequency $f_0=45$ Hz is selected such that sufficient stability margin is provided in the grid-connected mode and rapid oscillation can be ensured in the islanding mode. A cutoff frequency $\varphi_i=10\pi$ is selected to allow the bandpass filter to have a suitable bandwidth. To allow the disturbance component of the bus voltage to form an effective positive feedback oscillation in the islanding mode, by using a characteristic root or the Routh stability criterion, the value range of the coefficient $k_P$ of the proportional amplification link may be calculated as (1.2, 14.4). The determination of $k_P$ according to the characteristic root or the Routh stability criterion is an existing technology in this field, and thus this application will not go into details. $k_P$=2.5 is selected to ensure the system to have a good stability margin in the grid-connected mode. Simulation results as shown in FIG. 11 can be obtained according to a corresponding newly-constructed simulation circuit built based on Simulink software and containing a voltage positive feedback control model as well as circuit and control parameters. After the DC islanding occurs at the moment of 1 s, the bus voltage gradually generates an oscillation of about 45 Hz, which indicates that the system is operating in the islanding mode. In the link of islanding determination, it is determined that the islanding occurs at the moment of 1.335 s, and the number of sustained oscillation cycles exceeds three at this moment. When the islanding is detected, a fluctuation value of the bus voltage is about 2.5% of a rated voltage. It is determined that the system is in the grid-connected mode if there is no specific frequency component in the bus voltage or the specific frequency component continuously decreases.

Figure 6:
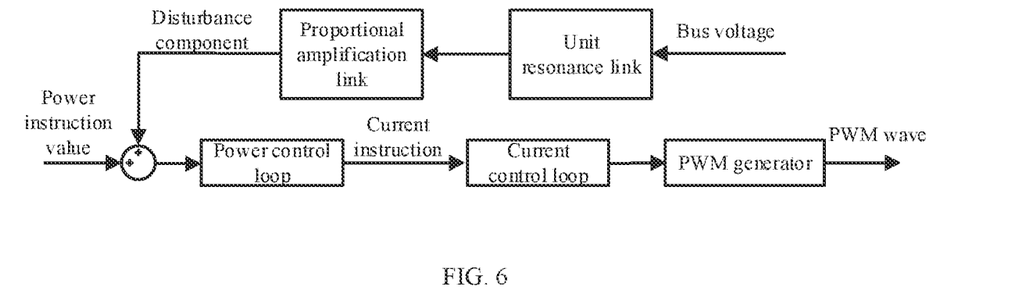
FIG. 6 is a block diagram of superimposing the disturbance component on a power control outer loop according to an embodiment of the present disclosure.
Figure 10:
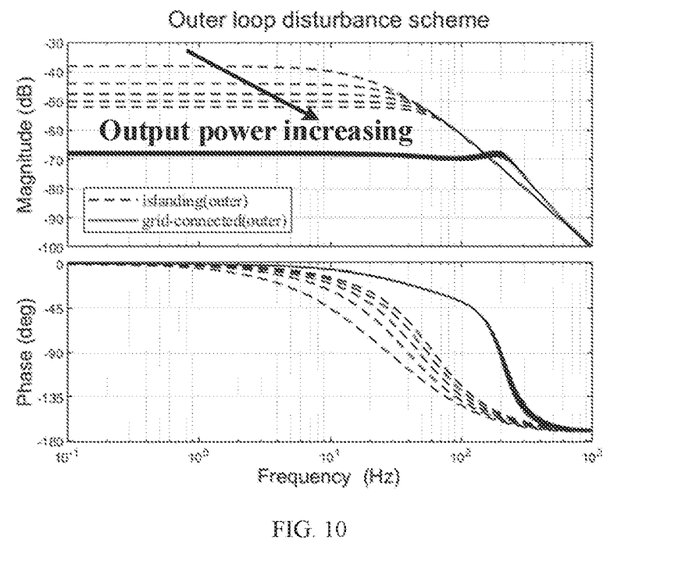
FIG. 10 illustrates magnitude-frequency response from the disturbance component to the bus voltage based on a power control outer loop disturbance injection method according to an embodiment of the present disclosure.
Figure 12:
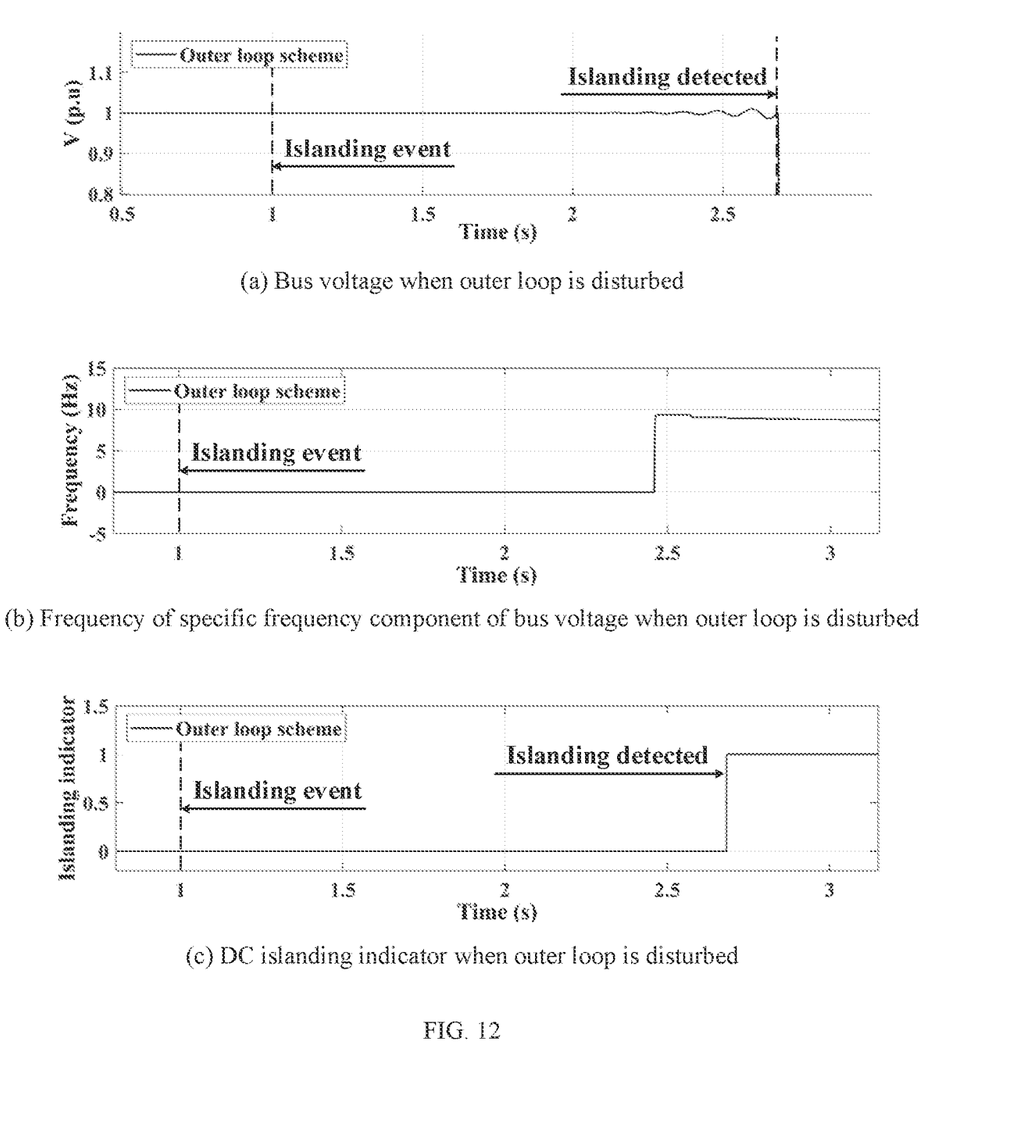
FIG. 12 is a diagram showing simulation results based on the power control outer loop disturbance injection method according to an embodiment of the present disclosure.

Embodiment 2: according to the method for islanding detection based on positive feedback of disturbance component injection of a power control loop, as shown in FIG. 6, a sampling value of the bus voltage is sent to a unit resonance link to obtain the specific frequency component of the bus voltage. The specific frequency component of the bus voltage is sent to a proportional amplification link to obtain the disturbance component. The disturbance component is superimposed on a power instruction value of the converter control outer loop to form the positive feedback of the bus voltage at the specific frequency. As shown in FIG. 10, magnitude-frequency response from the disturbance component to the bus voltage in the grid-connected mode and the islanding mode at different output powers may be obtained according to circuit parameters and control parameters. A resonance frequency $f_0$=10 Hz is selected such that sufficient stability margin is provided in the grid-connected mode and rapid oscillation can be ensured in the islanding mode. A cutoff frequency $\varphi_i$=10$\pi$ is selected to allow the bandpass filter to have a suitable bandwidth. To allow the disturbance component of the bus voltage to form an effective positive feedback oscillation in the islanding mode, by using a characteristic root or the Routh stability criterion, the value range of the coefficient $k_P$ of the proportional amplification link may be calculated as (420, 2700). The determination of $k_P$ according to the characteristic root or the Routh stability criterion is an existing technology in this field, and thus this application will not go into details. $k_P$=500 is selected to ensure the system to have a good stability margin in the grid-connected mode. Simulation results as shown in FIG. 12 can be obtained according to a corresponding newly-constructed simulation circuit built based on Simulink software and containing a voltage positive feedback control model as well as circuit and control parameters. After the DC islanding occurs at the moment of 1 s, the bus voltage immediately generates an oscillation of about 10 Hz, which indicates that the system is operating in the islanding mode. In the link of islanding determination, it is determined that the islanding occurs at the moment of 2.683 s, and the number of sustained oscillation cycles exceeds three at this moment. When the islanding is detected, the fluctuation value of the bus voltage is about 2.5% of the rated voltage. It is determined that the system is in the grid-connected mode if there is no specific frequency component in the bus voltage or the specific frequency component continuously decreases.

Figure 7:
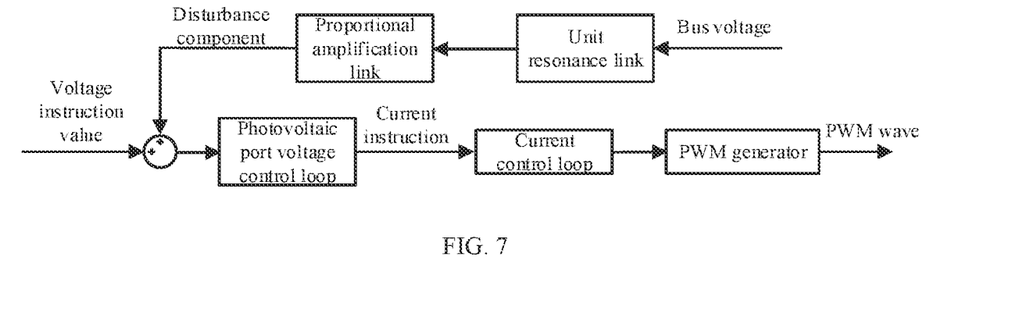
FIG. 7 is a block diagram of superimposing the disturbance component on a photovoltaic port voltage control outer loop according to an embodiment of the present disclosure.
Figure 8:
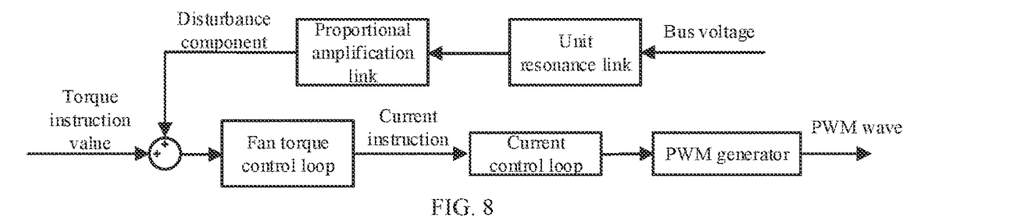
FIG. 8 is a block diagram of superimposing the disturbance component on a fan torque control outer loop according to an embodiment of the present disclosure.

In addition to superimposing the disturbance component on the current instruction value (FIG. 5) and on the power control instruction value (FIG. 6), other implementations may also be adopted. As shown in FIG. 7, the disturbance component is superimposed on a photovoltaic port voltage instruction value of a photovoltaic converter control outer loop to generate a new control instruction, and the new control instruction is sent to a photovoltaic port voltage outer loop. As shown in FIG. 8, the disturbance component is superimposed on a torque instruction value of a fan converter control outer loop to generate a new control instruction, and the new control instruction is sent to a torque control outer loop. By selecting an appropriate proportionality coefficient, the specific frequency component of the bus voltage is amplified when the DC system is in the islanding mode, then the disturbance component is continuously amplified, and the formation of the positive feedback mechanism accelerates the oscillation of the bus voltage at the specific frequency. In the grid-connected mode, due to the existence of the voltage management unit, the amplification of the disturbance component to the specific frequency component of the bus voltage is suppressed, such that the bus voltage remains stable and the positive feedback mechanism fails.

To sum up, in the present disclosure, the islanding detection is quickly completed through a voltage fluctuation with a small magnitude thus to ensure that the bus voltage is still in the normal operating range of 0.88-1.1 [PU] when the islanding detection is completed, thereby improving the power quality during the islanding detection. Furthermore, a false detection caused by the bus voltage exceeding the normal range under other abnormal operating conditions, such as bus short circuit or power disturbance, can be avoided, such that the detection accuracy can be improved. In this disclosure, the occurrence of islanding is characterized by a method of combining the voltage fluctuation frequency with the magnitude, i.e., the variation of the specific frequency component of the bus voltage. In the grid-connected mode, the existence of the voltage management unit disables the voltage positive feedback link loaded by the power management unit, such that the bus voltage remains stable. When islanding occurs, the system loses the voltage management unit, such that the bus voltage generates oscillations at a specific frequency to characterize the occurrence of islanding under the action of the positive feedback at the specific frequency.

To ensure the oscillation frequency of the bus voltage is fixed and known when the islanding occurs, a resonance link is added into the voltage feedback loop in this application. The introduction of the resonance link ensures that the voltage feedback loop only contains the signals at the specific frequency and attenuating the signals at other frequency bands. Therefore, after the occurrence of the DC islanding, only the voltage fluctuation of the specific frequency may be formed. In order to avoid false detection caused by other voltage fluctuations, a frequency selector and a filter are utilized in the link of islanding determination to extract the specific frequency component of the bus voltage obtained after the islanding occurs, and other frequency component signals are suppressed. The bus voltage fluctuation caused by random fluctuation of the output power of a distributed power source or by short circuit of the system is a step response or random fluctuation, which can be filtered by the filter in the islanding determination link, and thus no false detection of islanding is caused.

Further, after the islanding occurs in the system, oscillations at a specific frequency may occur in the bus voltage. Therefore, it can be determined that the system is in an islanding state only by detecting the voltage fluctuation of a small magnitude at the specific frequency (the magnitude of fluctuation of the bus voltage is less than 5% of the rated voltage) without shifting the bus voltage out of the normal range. This contributes to improving the power supply quality when the islanding detection is completed and to assisting in seamless switching of microgrids. There only exists a single variable (voltage magnitude) in the DC system, none of existing DC islanding detection methods in this field fully exploits frequency information of the bus voltage fluctuation when the islanding occurs.

Technical contents and technical features of the present disclosure have been disclosed above. However, those skilled in the art may still make various substitutions and modifications based on the teaching and disclosure of the present disclosure without departing from the spirit of the present disclosure. Therefore, the protection scope of the present disclosure should not be limited to the contents disclosed in the embodiments, but should include various substitutions and modifications that do not depart from the present disclosure, and are covered by the claims of the present disclosure.

What is claimed is:

1. A method for direct current (DC) islanding detection based on positive feedback of a bus voltage at a specific frequency, comprising following steps:

extraction of a component of the specific frequency of the bus voltage: collecting information of the bus voltage in real time and sending the information of the bus voltage to a bandpass filter by a power management unit in a DC system to obtain the component of the specific frequency of the bus voltage, wherein the bandpass filter is a unity gain resonance amplifier, and the component of the specific frequency is a resonance frequency of the unity gain resonance amplifier;

injection of a disturbance component of the specific frequency: sending the component of the specific frequency of the bus voltage to a proportional amplifier to obtain the disturbance component, and superimposing the disturbance component on a converter control inner loop instruction value or superimposing the disturbance component on a converter control outer loop instruction value, and then forming the positive feedback of the component of the specific frequency of the bus voltage on a control loop of converter, wherein selecting the resonance frequency of the unity gain resonance amplifier comprises: a magnitude gain of a transfer function from the disturbance component to the bus voltage being represented by k2(f) in an islanding mode, the magnitude gain of the transfer function from the disturbance component to the bus voltage being represented by ki(f) in a grid-connected mode, a difference therebetween being defined as G=k2(f)−ki(f), and a frequency $f_o$ corresponding to a maximum value of G being selected as the resonance frequency of the unity gain resonance amplifier; and determination of DC islanding: determining whether DC islanding occurs according to a variation trend of the component of the specific frequency of the bus voltage, determining that the system is operating in the islanding mode if the component of the specific frequency of the bus voltage continuous to increase and the number of sustained oscillation cycles exceeds a detection set value, or determining that the system is operating in the grid-connected mode if the component of the specific frequency in the bus voltage doesn't exist or the component of the specific frequency continuous to decrease, wherein the detection set value of the number of the sustained oscillation cycles is three.

2. The method for DC islanding detection based on the positive feedback of the bus voltage at the specific frequency according to claim 1, wherein the superimposing the disturbance component on the converter control inner loop instruction value specifically comprises: superimposing the disturbance component on a current instruction value of the converter control inner loop to generate a new control instruction, and sending the new control instruction to a current control inner loop.

3. The method for DC islanding detection based on the positive feedback of the bus voltage at the specific frequency according to claim 1, wherein the superimposing the disturbance component on the converter control outer loop instruction value specifically comprises: superimposing the disturbance component on a power instruction value of the converter control outer loop to generate a new control instruction, and sending the new control instruction to a power control outer loop.

4. The method for DC islanding detection based on the positive feedback of the bus voltage at the specific frequency according to claim 1, wherein the superimposing the disturbance component on the converter control outer loop instruction value specifically comprises: superimposing the disturbance component on a photovoltaic port voltage instruction value of a photovoltaic converter control outer loop to generate a new control instruction, and sending the new control instruction to a photovoltaic port voltage control outer loop.

5. The method for DC islanding detection based on the positive feedback of the bus voltage at the specific frequency according to claim 1, wherein the superimposing the disturbance component on the converter control outer loop instruction value specifically comprises: superimposing the disturbance component on a torque instruction value of a fan converter control outer loop to generate a new control instruction, and sending the new control instruction to a torque control outer loop.

* * * * *